United States Patent [19]

Sadler et al.

[11] 4,407,697

[45] Oct. 4, 1983

[54] PROCESS FOR MAKING ELECTRICAL INSULATING PAPER AND THE PRODUCT THEREOF

[75] Inventors: Fred S. Sadler, St. Jessup, Pa.; Paul F. Hettwer; Vu H. Viet, both of Franksville, Wis.; Clarance R. Acker, Zanesville, Ohio

[73] Assignee: McGraw-Edison Company, Rolling Meadows, Ill.

[21] Appl. No.: 365,523

[22] Filed: Apr. 5, 1982

[51] Int. Cl.[3] ........................ D21H 1/48; H05K 5/00

[52] U.S. Cl. .................................... 162/137; 162/138; 162/158; 162/174; 174/17 LF; 174/110 P; 427/121; 427/414; 428/537; 428/474.4; 428/474.6

[58] Field of Search ............... 162/138, 158, 137, 174; 427/121, 414; 428/474, 476, 537; 174/17 LF, 25 C, 110 P

[56] References Cited

U.S. PATENT DOCUMENTS

| | | | |
|---|---|---|---|
| 2,339,707 | 1/1944 | Kress et al. | 106/142 |
| 3,119,732 | 1/1964 | Robertson et al. | 162/174 |
| 3,135,627 | 6/1964 | Sadler | 162/138 |
| 3,166,466 | 1/1965 | Puydak | 162/174 |
| 3,211,516 | 10/1965 | Sadler | 162/158 |
| 3,224,902 | 12/1965 | Sadler et al. | 162/138 |
| 3,328,184 | 6/1967 | Weber | 106/130 |
| 3,736,178 | 5/1973 | Sadler et al. | 162/138 |
| 3,903,352 | 9/1975 | Suter et al. | 174/110 P |
| 3,931,027 | 1/1976 | Sadler et al. | 162/138 |
| 4,196,044 | 4/1980 | Mussoni et al. | 162/138 |

*Primary Examiner*—Peter Chin
*Attorney, Agent, or Firm*—J. C. Gealow; J. A. Gabala; P. Jonathan

[57] ABSTRACT

The invention relates to a method for improving the thermal stability and dielectric integrity of a cellulosic web product. The cellulosic web is impregnated with a nitrogen donor compound such that the web contains not less than 0.2% by weight of the compound and thereafter impregnated with an aqueous vegetable protein solution at a pH of not less than about 8.5.

11 Claims, 3 Drawing Figures

PROCESS FOR MAKING ELECTRICAL INSULATING PAPER AND THE PRODUCT THEREOF

FIELD OF THE INVENTION

This invention relates to the treatment of cellulose material for use as insulating paper, and to the product thereof. In its more specific aspect, this invention relates to the treatment of low density paper to improve its dielectric integrity for use as insulating paper, and to the product thereof.

BACKGROUND OF THE INVENTION AND PRIOR ART

Paper products formed from lignocellulose pulps are commonly employed as insulation for various electrical apparatus. Such products are particularly useful for this purpose because of their dielectric strength and their economic advantage. The paper may be used, for example, as dielectric spacers in capacitors or as insulating sheet for windings in a transformer. Typically the electrical apparatus, encased in an appropriate housing, is immersed in a liquid dielectric such as petroleum oil, waxes or chlorinated hydrocarbons.

Paper insulating materials used in electrical apparatus are ordinarily subjected to elevated temperatures, and it has long been recognized that the insulating papers deteriorate rapidly in use. This deterioration still exists when the insulating papers are in contact with, or immersed in, a liquid dielectric such as transformer oils. The elevated temperatures may cause the liquid dielectric to break down into acids or other chemical constituents which attack or degrade the cellulose insulation material. As a consequence, the insulating paper gradually deteriorates thereby adversely affecting its electrical and mechanical properties. For this reason the paper is treated or impregnated with various materials or compounds to improve the electrical performance and stability of the paper.

A number of prior art patents disclose impregnating the paper with a nitrogen-donor compound or compounds in order to increase the nitrogen content of the paper thereby improving its insulating properties, especially thermal stability. Representative U.S. patents include U.S. Pat. No. 2,535,960 (impregnating the pulp with acrylonitrile); U.S. Pat. No. 3,102,159 (melamine and dicyandiamide added to the paper at the sizing tank); U.S. Pat. No. 3,469,219 (paper impregnated with a guanamine). Other prior art U.S. patents disclose sizing the paper with a protein such as casein or soybean protein. These patents include, for example, U.S. Pat. Nos. 2,339,707, 3,119,732, 3,166,466 and 3,328,184.

The prior art also discloses treating the paper simultaneously with a nitrogen donor compound and a protein. Representative U.S. patents disclosing this combination include U.S. Pat. Nos. 3,135,627, 3,211,516 and 3,224,902. Also U.S. Pat. No. 4,196,044 discloses a creping and calendering process for increasing the density of the paper by treating the paper with a creping compound (e.g., casein) and states generally that the paper product formed by the process may be sprayed or dipped with a nitrogen-donor compound (e.g., dicyandiamide).

The prior art teachings, however, are all deficient in one or more respects. There is no teaching or suggestion as to certain essential process conditions and/or process steps. We have found most unexpectedly that this combination of certain process conditions and steps is critical to the preparation of insulating paper exhibiting improved dielectric integrity. Equally significant, the prior art and the accepted practice in the electrical industry utilize exclusively high density papers (i.e., papers having a density greater than 0.9 gm/cm$^3$, and typically 1.0 gm/cm$^3$ or greater) and particularly in areas where electrical apparatus requires high dielectric strength. Low density paper inherently exhibits a low dielectric strength and therefore this is one factor that should prohibit its use as insulating paper. We have found, contrary to the prior art and industry practice, that our process is especially applicable to low density paper thereby improving its electrical integrity.

This invention has as its purpose to provide a process for preparing paper cellulose material, especially low density paper, exhibiting improved dielectric integrity, and the product formed therefrom. This together with other objects and advantages of the invention may be further understood by reference to the following detail description and accompanying drawings.

DRAWINGS

SUMMARY OF INVENTION

Figure 1:
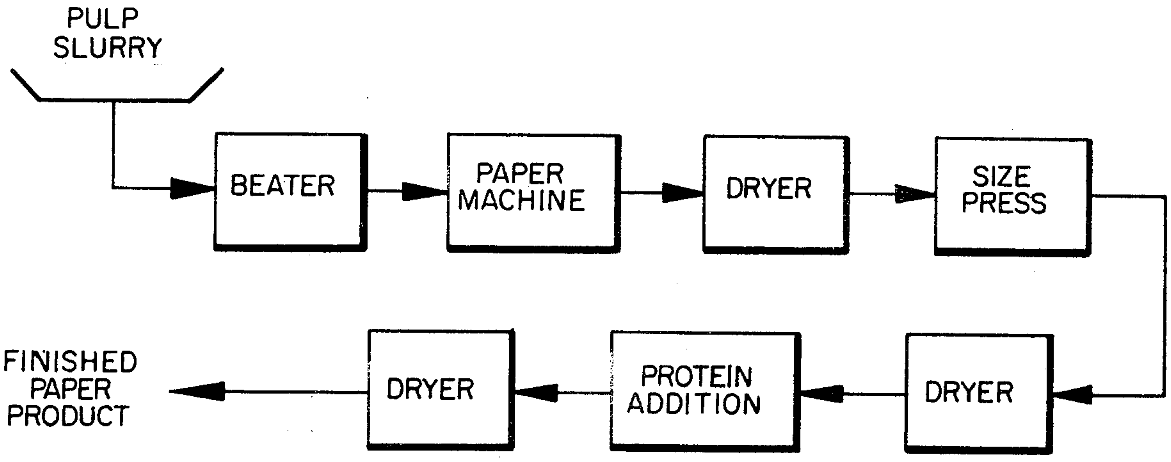
FIG. 1 is a flow diagram illustrating the process of this invention.

Broadly, this invention comprises a unique treatment of cellulosic material in order to improve its electrical integrity. The cellulosic material, desirably in paper sheet or web form made from lignoscellulose-pulps using Kraft processes or other processes such as sulfite, is first treated or impregnated with a nitrogen-donor compound or compounds in order to incorporate not less than 0.2% by weight nitrogen into the cellulose material, said weight based on the dry weight of the paper. The nitrogen-donor serves as a thermal stabilizer, and insulating paper treated with such a compound can better withstand degradation or deterioration when subjected to electrical and thermal stresses.

The paper web is thereafter treated or impregnated with a water soluble vegetable protein in order to improve the dielectric strength of the paper. The protein is solubilized in water rendered alkaline as by the addition of ammonium hydroxide so as to have a pH of not less than about 8.5. It is essential that the protein be in solution because uniform treatment of the paper with protein cannot be achieved if the protein is in dispersion. Also the protein solution should be alkaline, because an acidic solution will degrade the paper. The paper web is then dried to the desired moisture content suitable for its purpose, typically about 5% water or less, based on the dry weight of paper.

We have discovered that the order of treatment, in combination with the process conditions, is especially important in the manufacture of paper adaptable for use as electrical insulation. It is essential that the nitrogen-donor compound (or compounds) be added to the paper first because it is too difficult to impregnate the paper with this compound after the vegetable protein has been added to the paper. Equally important, if the nitrogen-donor compound and vegetable protein are added to the paper at the same time, the nitrogen-donor compound and protein react thereby losing the value of each. On the other hand, by following the procedure of this invention, the vegetable protein will flow into the paper without reacting with the nitrogen-donor compound. Thus paper made in accordance with the present invention exhibited improved dielectric strength, thermal stability, tensile strength, burst strength and fold endurance. Paper impregnated with oil and tested before and after aging likewise exhibited a marked improvement in properties. For these reasons, papers formed by this invention are particularly suitable for use as electrical insulation such as in transformers.

We further have discovered that our invention is especially applicable to paper having a low denisty, i.e., not greater than 0.9 $gm/cm^3$, which finding is contrary to the teachings of the prior art and accepted practice in the paper insulating industry. Under the most desirable circumstances, the paper should have the highest mechanical strength possible, the highest dielectric strength possible, and the lowest density possible. This balance in properties is exceedingly difficult to achieve because emphasizing one property will mean a sacrifice in another. When paper utilized as insulation is immersed in a liquid dielectric (e.g., transformer oil), the dielectric constant for the composite is different from that of each of the components and is likely to be different for low density paper than for high density paper. The dielectric stress for high density paper is expected to be higher than that of low density paper. However, the liquid dielectric which impregnates the paper serves to distribute the dielectric stress. It is essential, therefore, to fill substantially all of the voids or interstices of the paper web with the liquid because a void is a potential weak spot. We have found that low density paper treated by our invention is more readily impregnable with the liquid dielectric because the voids are more readily filled and the weak spots substantially eliminated. Therefore the dielectric stress of the low density paper is more evenly distributed. Thus such paper exhibits improved dielectric integrity.

DETAILED DESCRIPTION AND PREFERRED EMBODIMENTS

In accordance with this invention, cellulose material is treated by an unique combination of process steps and process conditions. Any of a variety of starting materials may be used as the base stock. Cellulose material preferably is formed as a continuous web or sheet by a conventional paper making process, such as by cylinder or Fourdrinier methods, which process, per se, forms no part of this invention. It is understood that the term "cellulose material" as used in this specification and in the appended claims is intended to include paper containing material fibers, synthetic fibers, or blends thereof, provided they do not adversely affect the physical or electrical properties of the end product. Paper of the Kraft variety is commonly employed in the electrical industry as insulating paper and is particularly suitable for the present invention, but it is understood that other paper, such as sulfite varieties, are also applicable.

Referring now to the flow diagram of FIG. 1, pulp slurry in the beater is passed to the paper machine for forming a continuous web. The wet web leaving the machine is dewatered by conventional techniques such as with vacuum, presses and/or dryers. The moisture content is reduced to about 10% by weight, dry basis, or less, and preferably to about 5%.

The dried web is first treated or impregnated with one or more nitrogen-donor compounds at the size press. Among such nitrogen-donor compounds are dicyandiamide, acrylonitrile, dimethyl formamide, melamine, a cylic diamine such as piperazine, and the like. Dicyandiamide is the preferred compound because it is a particularly good nitrogen-donor to cellulose and therefore a good thermal stabilizer, it is readily available and it is economical. A solution or emulsion of the compound may be applied to the web as spraying, brushing, dipping, etc. and preferably by size press addition in the conventional manner. The nitrogen-donor compound should be allowed to penetrate deep into the paper and be substantially uniformly distributed throughout the paper. In this manner the nitrogen content of the paper is increased to at least about 0.2% by weight on a dry weight basis, and preferably not less than 0.5% by weight. The amount of nitrogen incorporated into the paper web at this first step, or the amount required, will depend largely upon the thermal stability required, the chemical compound used, and the end use application. Generally there is no need to add more than about 4 weight percent nitrogen because no increased benefit is achieved or noticeable with increased amounts and because it is not economical to add more. The paper web is then appropriately dried by conventional means to evaporate the solvent and to a moisture content not greater than about 10 weight percent.

Thereafter the paper web is treated or impregnated with a vegetable protein soluble in an alkaline solution. Such protein includes, for example, a soybean protein, vegetable casein, alpha protein, cereal flours, and the like. A particularly suitable protein is protein isolated from soybeans, which is readily available and relatively inexpensive, and the invention will be described hereafter with particular reference to this preferred protein, but it should be understood that other proteins are also applicable. An alkaline solution containing about 1 to 15 weight percent soybean protein may be used in treating the paper, and more preferably 2 to 10 weight percent, and the protein should be distributed substantially uniformly throughout the paper. The amount of protein incorporated into the paper from such solutions will depend largely upon the dielectric strength required and the end use application. Here, too, the protein solution may be applied by conventional means such as brushing or spraying, but preferably by size press addition. The paper is then dried by conventional means, or as in the laboratory on a weighted press dryer, to produce a treated paper which is essentially wrinkle free. As explained above, the sequence in process steps by adding first the nitrogen-donor compound and thereafter the vegetable protein is particularly important.

In the preferred embodiment of preparing the soybean protein solution, this protein, typically in powder form, is first dispersed in warm water desirably at a temperature of about 140°-120° F. Sufficient ammonium hydroxide is then added to dissolve the protein and the temperature raised to about 104°-150° F. The resulting solution should have a pH of not less than about 8.5, and more preferably 9 to 10, in order to completely stabilize the solution.

In order to more fully describe the benefits and advantages obtained by practicing this invention, the following examples are given by way of illustration and not be way of limitation. The examples illustrate the improved results obtained in using the treated cellulose insulation material in electrical apparatus. It will be noted that the accelerated aging tests were conducted under conditions which were intended to simulate in so far as possible the conditions to which cellulose insulating materials are subjected during normal operation of an oil filled transformer.

In preparing each of the samples, electrical grade Kraft paper 5 mils thick and having a density of 0.79 gm/cm$^3$ (as determined by ASTM D202-72a Wet Basis) was treated with a 3 weight percent solution of dicyandiamide by size press addition. The paper was dried at 125° F. for approximately 20–25 minutes. The paper contained 3.75% nitrogen. The paper was then cut to sample sheets measuring 8½ inches by 11 inches. Three separate solutions containing 2%, 5% and 10% soybean protein (all percentages by weight) were prepared by dissolving the protein in warm water to which has been added 14% ammonium hydroxide (26° Be) based on the dry weight of soy protein. The three alkaline solutions had a pH of 9–9.7. The soy protein used was Procote-3000 sold by Ralston Purina Co. Sample sheets having been first treated with dicyandiamide were then immersed into soy protein solutions for approximately five minutes. The sheets were then dried at 120°–125° F. for 25–30 minutes on a weighted press dryer. A sample containing no soy protein (but treated with dicyandiamide) was also prepared. All samples were equilibrated prior to testing at 50% relative humidity and 73° F. for 48 hours.

Some sample sheets were tested for physical properties, and the results are shown in Table I.

TABLE I

| Treat Properties | No Protein MD/CD* | Treated With 2% Procote MD/CD | Treated With 5% Procote MD/CD | Treated With 10% Procote MD/CD | Test Procedure MD/CD |
|---|---|---|---|---|---|
| | Physical Properties of Treated Paper | | | | |
| Breakdown Strength volts/mil | 156 | 166 | 164 | 180 | ASTM D149-75 |
| Tensile Load lbs | 47/21 | 53/26 | 56/29 | 65/31 | TAPPI T404-0S76 |
| Burst (lb/in) | 67 | 68 | 73 | 71 | TAPPI T403-0S76 |
| Fold Endurance double-fold | 652/305 | 583/379 | 1576/662 | 1274/691 | TAPPI T511-SU69 |
| Apparent Density g/cm$^3$ | 0.79 | 0.78 | 0.82 | 0.86 | TAPPI UM444 TAPPI T411-ts65 |
| Nitrogen Content (%) | 3.75 | 3.73 | 3.82 | 3.96 | Kjeldahl method |

*Machine direction/cross direction

Other sample sheets were subjected to accelerated aging tests by aging in Texaco 55 transformer oil at 170° C. for 5 days. The aging test is described by B. D. Brummet in *Insulation*, pp. 35–37, August, 1964. According to this procedure, paper is wrapped around a copper strip measuring 12"×½"×1 mil. This is held by a copper wire and placed in a container, sealed and a vacuum pulled. The temperature is raised to 105° C. and held there for 16 hours to remove the moisture from the paper. Transformer oil, which had been predried to 15 ppm moisture, was then added to the container to impregnate the paper. A blanket of dry air is maintained above the oil at 1 psi, and then heated to 170° C. and held there for 5 days. The paper was removed and tested, and the results are set forth in Table II.

TABLE II

| Treat Properties (machine direction) | No Protein B.A* | No Protein A.A** | Treated With 2% Procote B.A | Treated With 2% Procote A.A | Treated With 5% Procote B.A | Treated With 5% Procote A.A | Treated With 10% Procote B.A | Treated With 10% Procote A.A | Test Procedure |
|---|---|---|---|---|---|---|---|---|---|
| | Physical Properties of Treated Paper | | | | | | | | |
| Breakdown Strength volts/mil | 646 | 1146 | 757 | 1249 | 748 | 1344 | 818 | 1484 | ASTM D149-75 |
| Tensile Strength lbs. | 47 | 56 | 52 | 54 | 56 | 55 | 59 | 61 | TAPPI T404-0S76 |
| Burst Strength (lb/in$^2$) | 59 | 48 | 61 | 45 | 72 | 42 | 70 | 36 | TAPPI T403-0S76 |

*Before aging
**After aging

Figure 2:
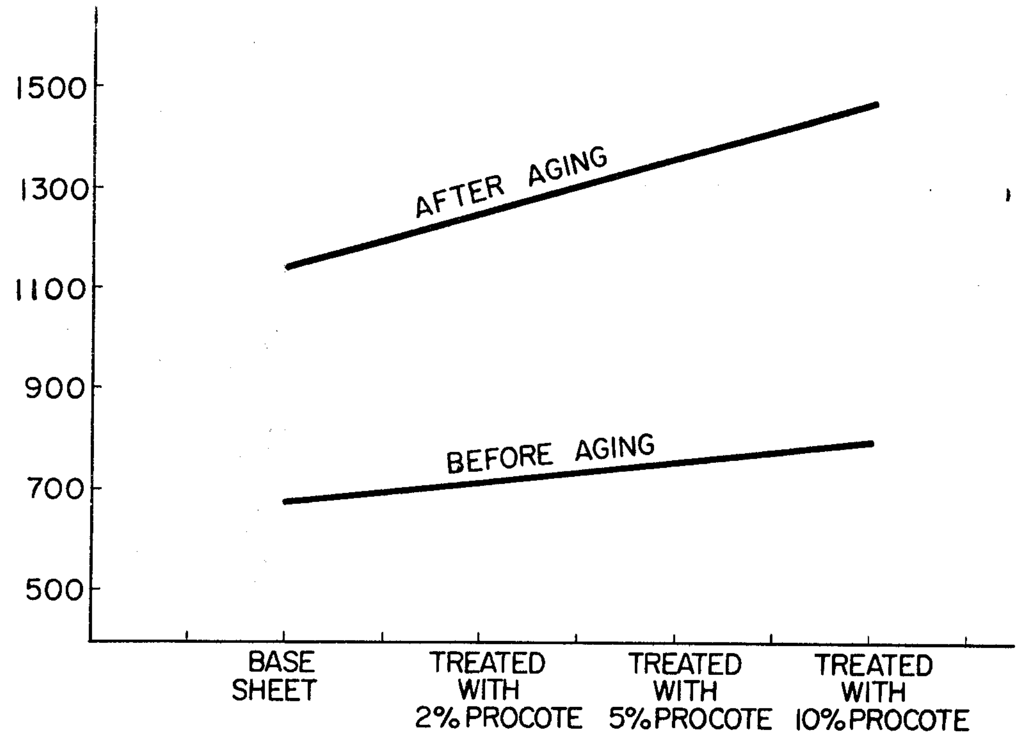
FIG. 2 is a graph showing the dielectric strength for paper samples treated by the process of this invention both before and after aging in transformer oil.

It was observed that the process of invention produced a well-bonded and more dense sheet. This improvement is manifested by the test results showing high physical properties, i.e., tensile and burst strengths and fold endurance. The good results in dielectric strength, which reached nearly 1500 volts per mil, are shown in FIG. 2.

Figure 3:
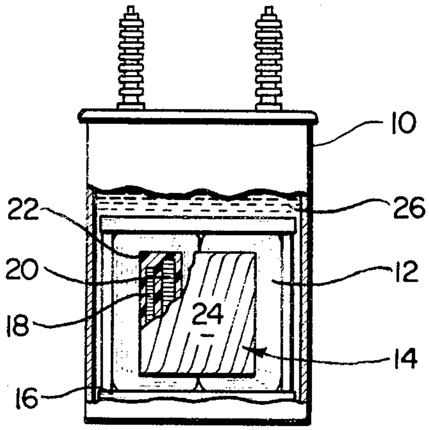
FIG. 3 is a view in elevation, partly broken, of a transformer utilizing insulating paper made in accordance with the present invention.

A transformer embodying cellulose insulation made in accordance with this invention is shown in FIG. 3. The transformer is encased within a tank 10 and consists essentially of a magnetic core 12 and a coil 14, both of which are supported in spaced relation from the bottom of tank 10 by channel support members 16 or the like. The coil 14 comprises a high voltage winding 18 and a low voltage winding 20 which are insulated from one another by the treated cellulose insulation 22. A treated cellulose wrapping 24 may also be applied to the exterior of the coil 14. A liquid dielectric 26 comprising oil, chlorinated diphenyl or the like is disposed within the tank 10 to cover the core 12 and the coil 14 in order to insulate them and to dissipate the heat generated during operation.

Although certain embodiments of the invention have been illustrated and described, many modifications and variations thereof will be obvious to those skilled in the art, and consequently it is intended in the appended claims to cover all such modifications and variations which fall within the true spirit and scope of the invention.

We claim:

1. A method for improving the thermal stability and dielectric integrity of cellulosic material especially adaptable for use as electrical insulation comprising: (a) forming a continuous web of cellulosic material, (b) impregnating said web with a nitrogen-donor compound in an amount sufficient to provide said web with a nitrogen content of not less than 0.2% by weight, (c) drying said web to a moisture content not greater than 10% by weight, (d) thereafter impregnating said web with an aqueous solution of a vegetable protein having a pH of not less than about 8.5, and (e) drying said web.

2. The method according to claim 1 wherein said nitrogen-donor compound is dicyandiamide.

3. The method according to claim 1 wherein said vegetable protein is soybean protein.

4. The method according to claim 1 wherein said web has a density not greater than 0.9 gm/cm$^3$.

5. The method according to claim 1 wherein said aqueous solution of vegetable protein has a pH of 9–10.

6. A method for improving the thermal stability and dielectric integrity of cellulosic material especially adaptable for use as electrical insulation comprising: (a) forming a continuous web of cellulosic material having a density of not greater than 0.9 gm/cm$^3$, (b) impregnating said web with dicyandiamide in an amount sufficient to provide said web with nitrogen content of not less than 0.2% by weight, (c) drying said web to a moisture content not greater than 10% by weight, (d) thereafter impregnating said web with an aqueous solution of soybean protein having a pH of about 9–10, and (e) drying said web.

7. The product of the process of claim 1.

8. A cellulosic product according to claim 7 wherein said web has a density not greater than 0.9 gm/cm$^3$.

9. The product of the process of claim 6.

10. In an electrical apparatus comprising in combination a container, an electrical conductor disposed in the container, cellulosic insulation applied to the conductor, and a liquid dielectric within the container surrounding the conductor and impregnating the cellulosic insulation, the improvement comprising incorporating first in the cellulosic insulation a nitrogen-donor compound in an amount sufficient to provide said cellulosic insulation with a nitrogen content of not less than about 0.2% by weight, and thereafter incorporating in said cellulosic insulation a vegetable protein from an aqueous solution having a pH of not less than 8.5.

11. The electrical apparatus according to claim 10 wherein said cellulosic insulation has a density not greater than 0.9 gm/cm$^3$.

* * * * *